(12) United States Patent
Takeuchi et al.

(10) Patent No.: US 7,889,510 B2
(45) Date of Patent: Feb. 15, 2011

(54) COMPONENT-EMBEDDED BOARD DEVICE AND FAULTY WIRING DETECTING METHOD FOR THE SAME

(75) Inventors: Satoshi Takeuchi, Nagoya (JP); Hiroki Kamiya, Nagoya (JP); Katsunori Kubota, Anjo (JP); Motoki Shimizu, Nagoya (JP)

(73) Assignee: Denso Corporation, Kariya (JP)

( * ) Notice: Subject to any disclaimer, the term of this patent is extended or adjusted under 35 U.S.C. 154(b) by 941 days.

(21) Appl. No.: 11/797,206

(22) Filed: May 1, 2007

(65) Prior Publication Data

US 2007/0263369 A1    Nov. 15, 2007

(30) Foreign Application Priority Data

May 9, 2006    (JP)    ............................. 2006-130455

(51) Int. Cl.
*H05K 1/18* (2006.01)
(52) U.S. Cl. ...................... 361/761; 361/763; 361/766; 361/795
(58) Field of Classification Search ......... 361/763–766, 361/794–795; 174/259–264
See application file for complete search history.

(56) References Cited

U.S. PATENT DOCUMENTS

| | | | |
|---|---|---|---|
| 5,877,033 A | 3/1999 | Matern | |
| 6,103,978 A | 8/2000 | Amir | |
| 6,512,182 B2 * | 1/2003 | Takeuchi et al. | ............ 174/256 |
| 6,680,441 B2 | 1/2004 | Kondo et al. | |
| 6,724,638 B1 * | 4/2004 | Inagaki et al. | ................ 361/763 |
| 2004/0091687 A1 | 5/2004 | Kondo et al. | |
| 2006/0261482 A1 | 11/2006 | Jow et al. | |
| 2007/0152339 A1 | 7/2007 | Jow et al. | |

FOREIGN PATENT DOCUMENTS

| | | |
|---|---|---|
| JP | A-2003-188340 | 7/2003 |
| JP | A-2005-294674 | 10/2005 |
| JP | A-2006-156482 | 6/2006 |

OTHER PUBLICATIONS

Office Action dated Mar. 23, 2010 from the German Patent Office in the corresponding German patent application No. 10 2007 021 064.9-34 (with English Translation).
Office Action dated Jun. 12, 2009 from the China Patent Office in the corresponding CN Application No. 2007101028502 (and English Translation).

* cited by examiner

*Primary Examiner*—Tuan T Dinh
(74) *Attorney, Agent, or Firm*—Posz Law Group, PLC (57) ABSTRACT

A component-embedded board device has a wiring board in which an electronic component is embedded, a connection member which is conductive and arranged at a surface of the wiring board, and an inner wiring unit which is arranged in the wiring board and connects an electrode of the electronic component with the connection member. The component-embedded board device is further provided with an inspection connection member for an inspection of a faulty wiring of the inner wiring unit, and an inspection wiring unit which is arranged in the wiring board and connects the inspection connection member with one of the electrode and a predetermined portion of the inner wiring unit. The inspection connection member is conductive and arranged at a surface of the wiring board.

9 Claims, 5 Drawing Sheets

COMPONENT-EMBEDDED BOARD DEVICE AND FAULTY WIRING DETECTING METHOD FOR THE SAME

CROSS REFERENCE TO RELATED APPLICATION

This application is based on a Japanese Patent Application No. 2006-130455 filed on May 9, 2006, the disclosure of which is incorporated herein by reference.

FIELD OF THE INVENTION

The present invention relates to a component-embedded board device and a faulty wiring detecting method thereof.

BACKGROUND OF THE INVENTION

Figure 9:
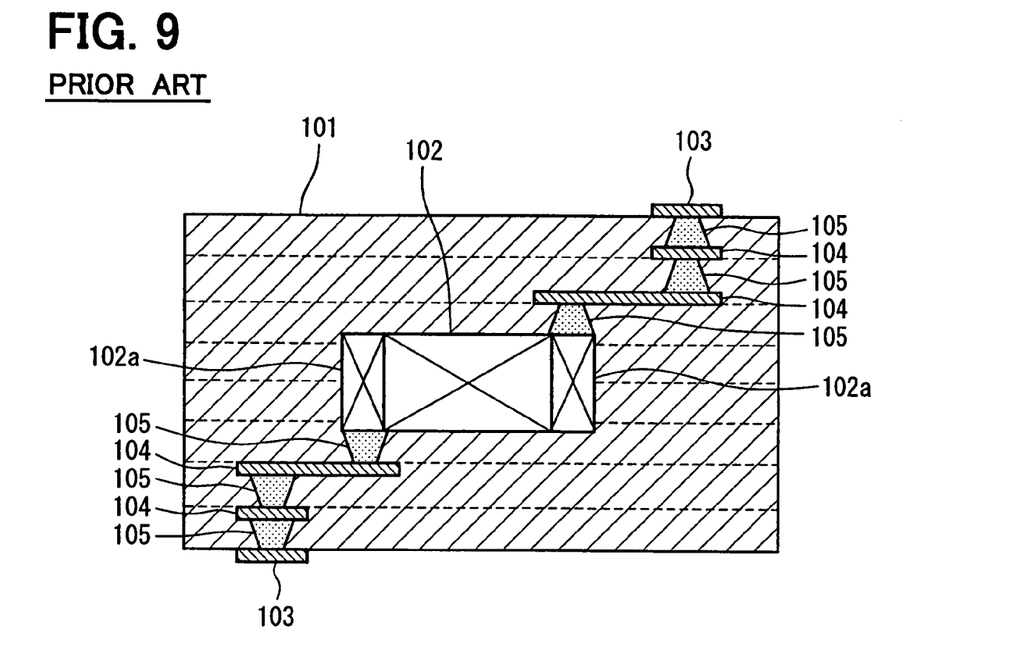
FIG. 9 is a longitudinally partially sectional view showing a multilayer wiring board according to a prior art.

Generally, as disclosed in JP-2003-086949A, a printed circuit board which is constructed of thermoplastic resin films is provided. The thermoplastic resin films are stacked and collectively pressed at a high temperature to construct the printed circuit board. In this case, as shown in FIG. 9, a chip resistance 102 is embedded in a board 101. An electrode 102a of the chip resistance 102 and a wiring 103 arranged at the surface of the board 101 are electrically connected with each other through inner wirings 104 and viae 105.

The inspection of the electrical connection for the chip resistance 102 is performed, by measuring the resistance value of the whole of the inner wiring including the chip resistance 102. In the case where the resistance value of the chip resistance 102 is large, the resistance value of the chip resistance 102 will be sufficiently large with respect to an increase of the resistance value due to a failure at the inner wiring 104 and/or the via 105 which are connected with the chip resistance 102. That is, the increase of the resistance value due to the failure of the inner wire 104 and/or the via 105 is buried by the resistance value of the chip resistance 102. Thus, it is difficult to detect the failure of the inner wire 104 and the via 105.

SUMMARY OF THE INVENTION

In view of the above-described disadvantage, it is an object of the present invention to provide a component-embedded board device where a faulty wiring of an inner wiring unit for connecting an embedded electronic component with a connection portion arranged at a board surface can be detected, and a faulty wiring detecting method thereof.

According to one aspect of the present invention, the component-embedded board device is provided with a wiring board in which an electronic component is embedded, a connection member which is conductive and arranged at a surface of the wiring board, an inner wiring unit which is arranged in the wiring board and conductively connects an electrode of the electronic component with the connection member, an inspection connection member for an inspection of an faulty wiring of the inner wiring unit, and an inspection wiring unit which is arranged in the wiring board and conductively connects the inspection connection member with one of the electrode and a predetermined portion of the inner wiring unit. The inspection connection member is conductive and arranged at a surface of the wiring board.

In the case where a faulty wiring occurs at the inner wiring unit, the resistance value through the inner wiring unit and the inspection wiring unit will have an increase. Because the inspection wiring unit conductively connects the inspection connection member with the one of the electrode and the predetermined portion of the inner wiring unit, this resistance value (without including that of electronic component) will be relatively small. Therefore, the faulty wiring of the inner wiring unit can be detected, by measuring the resistance value between the connection member and the inspection connection member.

According to another aspect of the present invention, a faulty wiring detecting method for the component-embedded board device includes detecting a resistance value between the connection member and the inspection connection member, and determining whether or not a faulty wiring occurs at the inner wiring unit based on the resistance value which is detected. It is determined that the faulty wiring occurs at the inner wiring unit in the case where the resistance value is different from a normal value.

Thus, the faulty wiring of the inner wiring unit of the component-embedded board can be substantially determined.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE EXAMPLED EMBODIMENTS

First Embodiment

A component-embedded board device according to a first embodiment of the present invention will be described with reference to FIGS. 1-5. The component-embedded board device can be suitably used as a vehicle-mounted board 1, for example.

Figure 2:
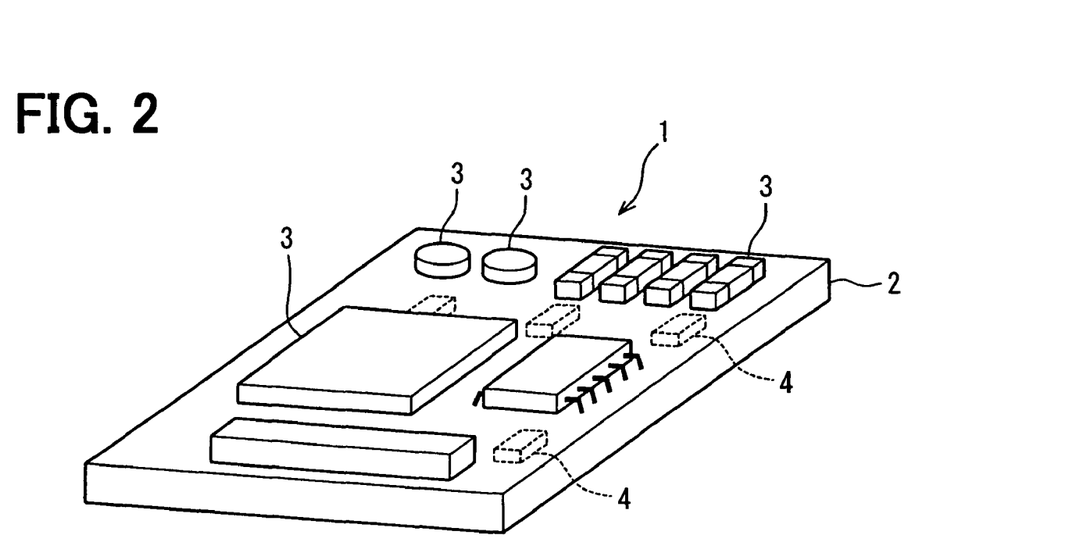
FIG. 2 is a perspective view showing a vehicle-mounted board according to the first embodiment.

As shown in FIG. 2, the vehicle-mounted board 1 can be provided with a multilayer wiring board 2. Various electronic components 3 are mounted at a component mounting surface of the multilayer wiring board 2, and connected with each other via the component mounting surface of the multilayer wiring board 2 and a wiring unit (not shown) arranged in the multilayer wiring board 2 to construct predetermined electronic circuits.

In this case, an electronic component 4 such as a chip resistance (e.g., chip passive component) and the like can be embedded in the multilayer wiring board 2, and connected with the other electronic components through the wiring unit to function as a resistance constructing a part of the electronic circuit.

Figure 1:
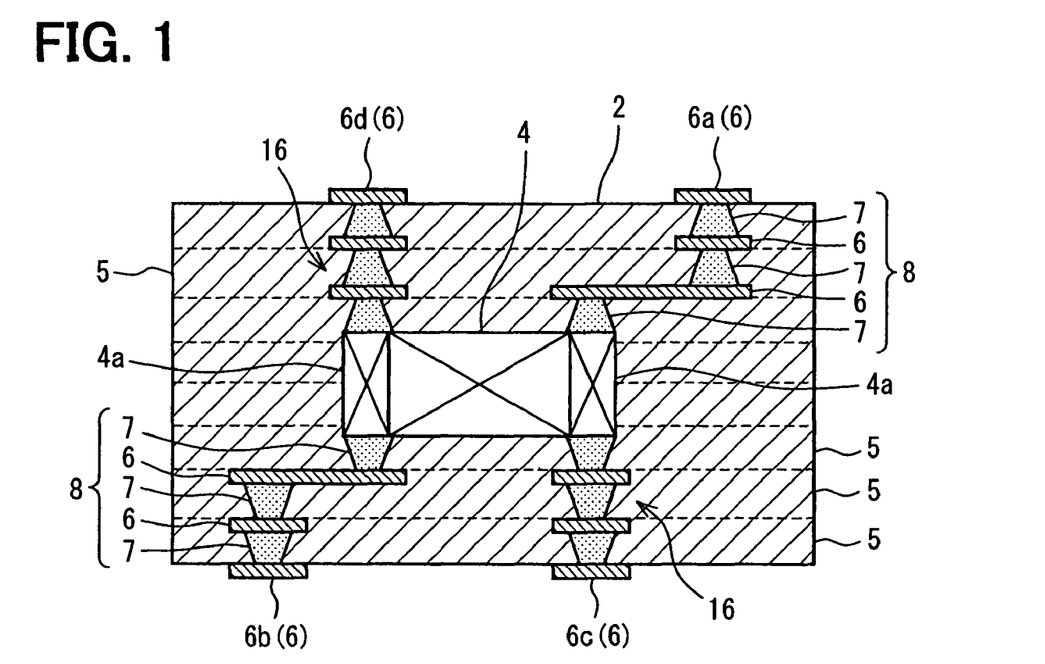
FIG. 1 is a longitudinally partially sectional view showing a multilayer wiring board according to a first embodiment of the present disclosure.

With reference to FIG. 1 (where electronic components 3 are not shown), the multilayer wiring board 2 has multiple insulating layers 5 (totaling 8, for example, as shown in FIG. 1) each of which can be constructed of a thermoplastic resin and which are stacked in a stacking direction, and multiple conductive patterns 6 each of which can be made of a copper foil, for example. The conductive patterns 6 are respectively arranged between the adjacent insulating layers 5 in the stacking direction and mounted to the outer surfaces of the insulating layers 5 of the outmost sides (e.g., uppermost side and lowermost side) in the stack direction.

Specifically, for example, the conductive pattern 6 (i.e., land 6a corresponding to connection member) and the conductive pattern 6 (i.e., land 6d for use in inspection corresponding to inspection connection member) can be arranged at the out surface of the insulating layer 5 of the uppermost side in FIG. 1. The conductive pattern 6 (i.e., land 6b corresponding to connection member) and the conductive pattern 6 (i.e., land 6c for use in inspection corresponding to inspection connection member) can be arranged at the out surface of the insulating layer 5 of the lowermost side in FIG. 1. That is, in this case, the inspection land 6c and the land 6b are positioned at the opposite side of the multilayer wiring board 2 to the inspection land 6d and the land 6a.

Furthermore, the multilayer wiring board 2 has therein multiple viae 7 which are respectively arranged at predetermined positions in the insulating layers 5. In this case, the adjacent conductive patterns 6 (in the stacking direction) are connected with each other through the via 7.

The chip resistance 4 which is embedded in the multilayer wiring board 2 is provided with electrodes 4a. The electrodes 4a are connected with the viae 7, which are respectively arranged in the insulating layers 5 (of third layer and sixth layer which are defined from upper side in FIG. 1, for example) adjacent to the insulating layers 5 where the chip resistance 4 is arranged. In this case, the multilayer wiring board 2 is provided with inner wiring units 8 each of which is constructed of the conductive patterns 6 and the viae 7 which are alternatively stacked. The thickness of the chip resistance 4 can be set to be two times the thickness of the insulating layer 5, for example.

Next, the manufacture method of the multilayer wiring board 2 will be described with reference to FIGS. 3-5.

At first, a base material manufacture process is performed to manufacture base material members 9 for constructing the insulating layers 5. Specifically, the conductive patterns 6 are formed on a film 10 which is made of a thermoplastic resin of a crystalline transition type to construct the insulating layer 5, and multiple via holes 11 for constructing the viae 7 are formed at predetermined positions of the film 10. Moreover, multiple conductive pastes 12 are respectively filled in the via hole 11. Thus, the base material member 9 is provided.

The film 10 can be constructed of a resin material (having a trade name of PAL-CLAD) consisted of a polyetheretherketone (PEEK) at 35-65% (weight) and a polyetherimide (PEI) at 35-65% (weight), for example. The film 10 can be provided with a thickness which is substantially equal to 25-75 micron, and shaped corresponding to the size of the multilayer wiring board 2.

Figure 5:
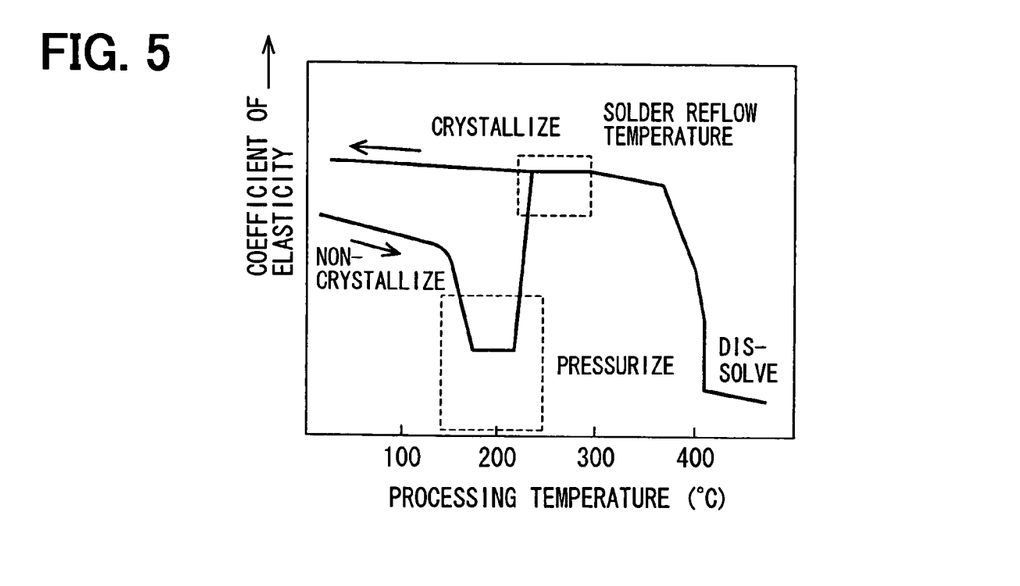
FIG. 5 is a graph showing a relation between a processing temperature of a thermoplastic resin and a coefficient of elasticity thereof according to the first embodiment.

With reference to FIG. 5 which shows a pressurization temperature condition, the resin material of the film 10 will be soft substantially at a predetermined temperature (e.g., 200° C.) and be hard at a temperature which is lower than or higher than the predetermined temperature. On the other hand, when the temperature becomes low from a high temperature, the resin material will keep hard even at the substantial predetermined temperature (e.g., 200° C.). The resin material will dissolve at a further high temperature, for example, 400° C.

Figure 4A:
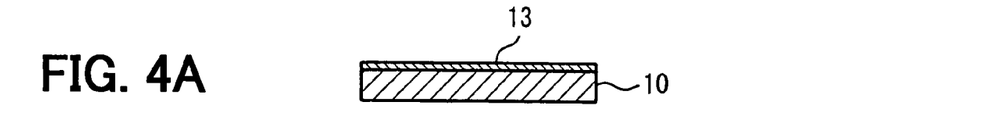
FIGS. 4A-4E are partially sectional views which respectively show manufacture processes of a base material according to the first embodiment.
Figure 4B:
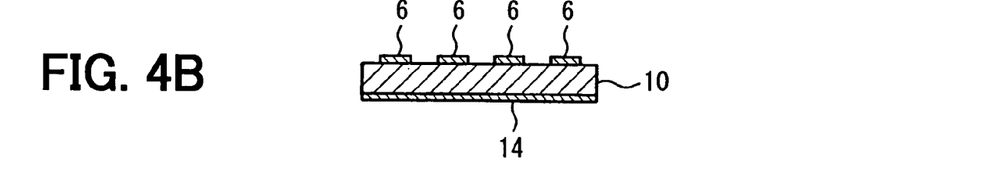

FIGS. 4A-4E show procedural steps for manufacturing the base material member 9. At first, as shown in FIG. 4A, a conductive foil 13, for example, a copper foil is adhered to the surface (e.g., upper surface) of the film 10. Then, as shown in FIG. 4B, the conductive pattern 6 is formed by etching (patterning) the copper foil 13 arranged at the film 10.

After the forming of the conductive pattern 6, a protection film 14 made of a polyethylene naphtahalate (PEN) or the like is adhered to the back surface (e.g., lower surface) of the film 10, as shown in FIG. 4B. The protection film 14 is positioned at an opposite side of the film 10 to the conductive pattern 6.

Figure 4C:
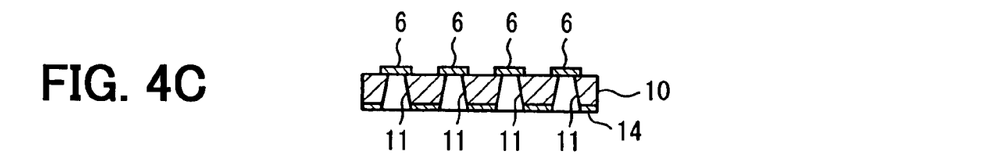

Then, as shown in FIG. 4C, the via holes 11 each of which is bottomed are respectively formed at predetermined portions of the film 10, by applying $CO_2$ laser or the like from the side of the protection film 14. In this case, the conductive patterns 6 respectively construct the bottoms of the via holes 11. The output and the irradiation time of $CO_2$ laser can be adjusted so that the conductive pattern 6 is not holed.

Figure 4D:
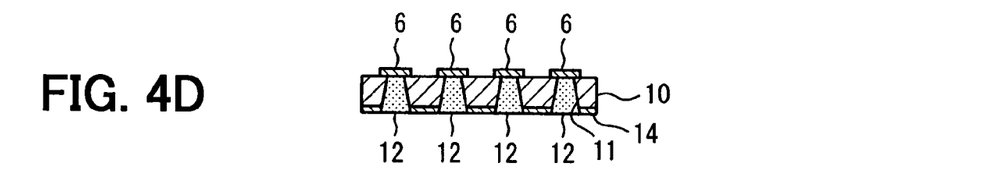
Figure 4E:
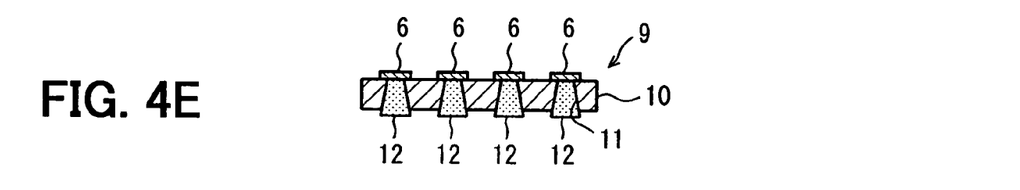

Thereafter, as shown in FIG. 4D, the conductive pastes 12 will be respectively filled into the via holes 11. That is, the via hole 11 is buried by the conductive paste 12. The conductive paste 12 can be consisted of metal (e.g., copper, silver, tin) grains in which a binder resin or an organic solvent is added and mixed. The conductive paste 12 can be print-filled into the via hole 11 by screen-printing where a metal mask or the like is used. After the conductive paste 12 is filled, the protection film 14 is peeled off from the film 10 as shown in FIG. 4E. Thus, the manufacture of the base material member 9 is finished.

As described above, the multiple base material members 9 are provided to construct the insulating layers 5. In this case, the base material members 9 (of third layer and sixth layer with reference to FIG. 3, for example) which are adjacent to the base material members 9 (of fourth layer and fifth layer with reference to FIG. 3, for example) where the chip resistance 4 is housed are also provided with the via holes 11, which are filled with the conductive pastes 12 and positioned respectively corresponding to the electrodes 4a of the chip resistance 4.

Moreover, in the manufacture process of the base material members 9 (of the fourth layer and the fifth layer shown in FIGS. 1 and 3) where the chip resistance 4 is housed, holes 15 having a predetermined shape (e.g., substantial rectangle shape) corresponding to that of the chip resistance 4 are respectively formed in the films 10 of these base material members 9. In this case, these base material members 9 of the fourth layer and the fifth layer shown in FIGS. 1 and 3 are not provided with the conductive patterns 6 and the via holes 11 filled with the conductive pastes 12.

Figure 3:
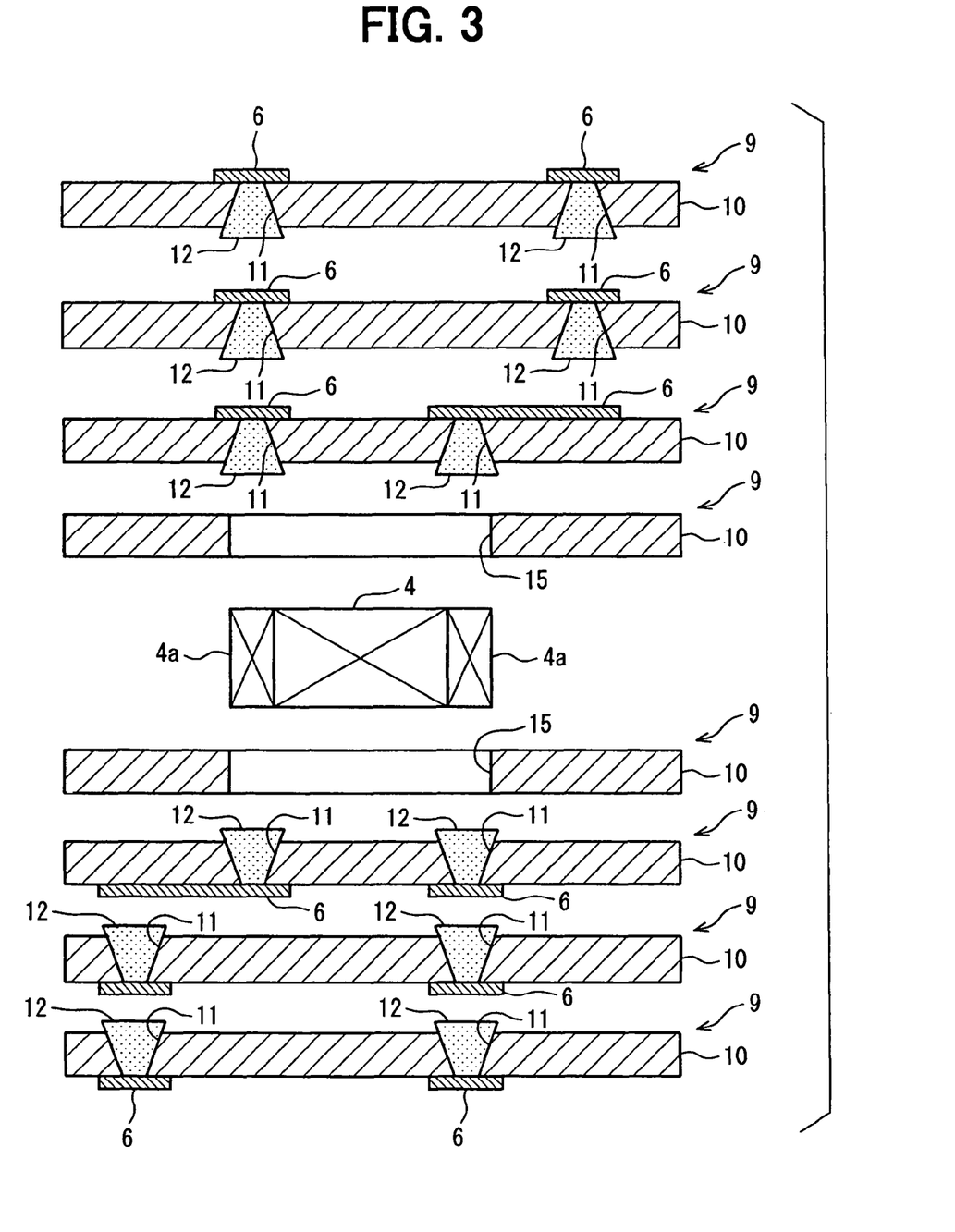
FIG. 3 is a disassembled partially sectional view showing the multilayer wiring board according to the first embodiment.

Then, with reference to FIG. 3, a stacking process is performed to stack the base material members 9 from the first layer to the fourth layer (which are formed as described above with reference to FIGS. 4A-4E), in such a manner that the surface (of each of these base material members 9) where the conductive patterns 6 are mounted faces a first predetermined direction, for example, faces an upper side in FIG. 3.

Moreover, in the stacking process, the base material members 9 from the fifth layer to the eighth layer (which are formed similarly to those from the first layer to the fourth layer) are stacked, in such a manner that the surface (of each of these base material members 9) where the conductive patterns 6 are mounted faces a second predetermined direction which is contrary to the first predetermined direction, for example, faces the lower side in FIG. 3.

As shown in FIG. 3, the chip resistance 4 is housed in the holes 15 of the two base material members 9 of the fourth layer and the fifth layer, in such a manner that the chip resistance 4 is sandwiched between the base material member 9 of the third layer and the base material member 9 of the sixth layer. Moreover, in this case, the chip resistance 4 is arranged in such a manner that the electrode surfaces of the chip resistance 4 are respectively disposed as the facade surface and the back surface thereof (e.g., surface of upper side and surface of lower side in FIG. 3). The electrode 4*a* of the chip resistance 4 is provided with a metal (e.g., metal, copper, tin and the like) coating which is diffusion-joinable to the conductive paste 12.

In this embodiment, the layers from the first layer to the eighth layer are defined (counted) from the upper side in FIGS. 1 and 3.

Next, a heat pressing process of the manufacture method of the multilayer wiring board 2 is performed, to collectively heat-press the base material members 9 (having layers totaling 8, for example) which have been stacked. In this heat pressing process, the base material members 9 are set at a vacuum pressurization pressing machine (not shown) or the like, to be pressurized in the stacking direction (e.g., up-down direction in FIG. 3) at a substantial pressure range from 0.1 Mpa to 10 Mpa in such a state that the base material members 9 are heated at a substantial temperature range from 200° C. to 350° C., for example.

As described above, with reference to FIG. 5, the coefficient of elasticity of the film 10 (which constructs base material member 9) will vary with respect to the temperature. Therefore, in the heat pressing process, the films 10 are pressurized in such a manner that the films 10 temporarily became soft due to heating, so that the films 10 are melted and joined to each other. Thereafter, the films 10 are crystallized (hardened) to become integrated with each other.

Thus, according to the above-described processes, the conductive patterns 6 are provided to be respectively arranged between the adjacent insulating layers 5 and mounted to the outer surfaces of the insulating layers of the outermost side. Moreover, the conductive paste 12 in the via hole 11 is hardened so that the via 7 is formed, as shown in FIG. 1. At the same time, the chip resistance 4 is embedded in the insulating layers 5 in such a state that the electrodes 4*a* of the chip resistance 4 are connected with the conductive patterns 6 of the insulating layers 5 (of third layer and sixth layer, for example) which are adjacent to those where the chip resistance 4 is housed. Thus, the multilayer wiring board 2 is constructed.

At this time, the metal coating of the electrode 4*a* of the chip resistance 4 and the conductive paste 12 in the via hole 11 diffuse mutually to form an alloy layer at the facade surface and the back surface of the electrode 4*a* of the chip resistance 4, so that the electrical connection between the chip resistance 4 and the conductive paste 12 can be performed and a substantially mechanical joining therebetween can be provided.

Moreover, according to this embodiment, the hole 15 is formed at the base material member 9 to house the chip resistance 4, so as to restrict the deformation of the multilayer wiring board 2 and the like. The deformation will be caused when the chip resistance 4 pushes aside the material (e.g., thermoplastic resin) of the base material member 9 in the heat pressing process.

According to this embodiment, the conductive patterns 6 (lands 6*a*-6*d*) which are mounted to the outer surfaces of the insulating layers 5 of the outermost side (e.g., first layer and eighth layer) of the multilayer wiring board 2 are connected with the electrode 4*a* of the chip resistance 4 through the inner wiring units 8 and the inner wiring units 16 (inspection wiring units 16) which are arranged in the multilayer wiring board 2.

In this case, each of the inner wiring units 8 and 16 is constructed of the viae 7 and the conductive patterns 6 arranged in the multilayer wiring board 2, which are electrically connected with each other. The two inner wiring units 8 can be provided to respectively electrically connect the lands 6*a*, 6*b* with the electrodes 4*a* of the chip resistance 4. The two inner wiring units 16 can be provided to respectively electrically connect the inspection lands 6*c*, 6*d* with the electrodes 4*a* of the chip resistance 4.

With reference to FIG. 1, the chip resistance 4 is connected between the land 6*a* (arranged at right upper side of FIG. 1, for example) and the land 6*b* (arranged at left lower side of FIG. 1, for example), respectively via the two inner wiring units 8.

However, because the inner wiring unit 8 is constructed of the conductive patterns 6 and the viae 7 which are stacked and joined, the resistance value of the inner wiring unit 8 may become larger than a normal value due to a faulty wiring in the case where the joining therebetween is not sufficient.

In the case where there occurs the faulty wiring at the inner wiring unit 8, the faulty wiring will develop due to the influence of heat and/or vibration because the vehicle-mounted board 1 is mounted at the vehicle. Thus, the normal operation of the electronic circuit may be hampered when the resistance value of the inner wiring unit 8 becomes excessively large.

In this case, the increase of the resistance value of the inner wiring unit 8 can be detected, by measuring the resistance value between the land 6*a* (or 6*b*) which is arranged at the outer surface of the insulating layer 5 of the first layer and the conductive pattern 6 which is arranged at the surface of the insulating layer 5 of the third layer, for example.

However, in the case where the resistance value of the chip resistance 4 positioned between the lands 6*a* and 6*b* is large (e.g., resistance value is equal to 1 MΩ), the increase of the resistance value will be buried in the admissible range of the resistance value of the chip resistance 4 so that it is difficult to detect the increase of the resistance value of the inner wiring unit 8.

Specifically, when the resistance value of the chip resistance 4 is substantially equal to 1 MΩ, the resistance value of the chip resistance 4 will have the substantial admissible range of 1 MΩ±50 MΩ. When there occurs the faulty wiring at the inner wiring unit 8 so that the resistance value becomes substantially equal to 3 MΩ, the increase of the resistance value will be buried in the admissible range of the chip resistance 4. Thus, it becomes difficult to detect the increase of the resistance value.

According to this embodiment, the inspection land 6*c*, 6*d* for use in inspection (inspection connection member) is constructed of the conductive pattern 6 which is positioned at the outer surface of the multilayer wiring board 2. The inspection land 6*d* and the land 6*a* (which are arranged at upper surface of multilayer wiring board 2 in FIG. 1, for example) are positioned at an opposite side of the multilayer wiring board 2 to the inspection land 6b and the land 6c (which are arranged at lower surface of multilayer wiring board 2 in FIG. 1, for example).

Moreover, the inspection lands 6c and 6d are connected with the electrodes 4a of the chip resistance 4 via the inspection wiring units 16 (inner wiring units). The inspection wiring unit 16 is constructed of the viae 7 and the conductive patterns 6 which are arranged in the multilayer wiring board 2 and alternately stacked.

In this case, the inspection land 6c, 6d is electrically connected with the electrode 4a through the viae 7 which are linearly arranged. That is, the inspection wiring unit 16 substantially linearly extends between the inspection land 6c, 6d and the electrode 4a. The inspection land 6c, 6d can be positioned at the outer surface of the multilayer wiring board 2, in such a manner that the inspection land 6c, 6d is electrically connected with the electrode 4a of the chip resistance 4 in a direction perpendicular to the surface of the electrode 4a.

In this case, the inspection wiring unit 16 has the similar construction to the inner wiring unit 8. Thus, the inspection wiring unit 16 can be manufactured simultaneously when the inner wiring unit 8 is manufactured as described above. Therefore, a particular means or process for manufacturing the inspection wiring unit 16 is unnecessary.

Thus, the faulty wiring of the inner wiring unit 8 which connects the land 6a and the one electrode 4a of the chip resistance 4 can be detected, by measuring the resistance value between the land 6a and the inspection land 6c (which is arranged at outer surface of multilayer wiring board 2 of opposite side to land 6a).

In this case, the land 6a and the inspection land 6c are connected with each other through the one electrode 4a of the chip resistance 4, so that the resistance value (without including resistance value of chip resistance 4) to be detected is a total of the resistance value of the inner wiring unit 8 and that of the inspection wiring unit 16. In this case, because the viae 7 are linearly connected to construct the inspection wiring unit 16, it can be considered that the resistance value of the inspection wiring unit 16 is extremely small and the possibility for the faulty wiring to occur is extremely low. Therefore, the resistance value between the land 6a and the inspection land 6c can be regarded as the resistance value of the inner wiring unit 8 which connects the land 6a and the electrode 4a.

For example, in the case where the resistance value between the land 6a and the inspection land 6c is generally equal to 100 mΩ (normal value), it can be determined that the faulty wiring occurs in the inner wiring unit 8 when the measured value of the resistance value between the land 6a and the inspection land 6c is larger than or equal to a predetermined value (e.g., 3Ω which is 30 times of normal value). Thus, when it has been determined that the faulty wiring occurs in the inner wiring unit 8, the multilayer wiring board 2 as the inspection object can be discarded, for example.

Similarly, the faulty wiring of the inner wiring unit 8 (at other side of multilayer wiring board 2) which connects the land 6b with the other electrode 4a can be detected, by measuring the resistance value between the land 6b and the inspection land 6d.

Thus, when it has been determined that the faulty wiring does not occur at the inner wiring units 8 as described above, a solder paste is applied by, for example, a screen printing, to predetermined portions of the component-mounting surface of the multilayer wiring board 2 and then the electronic components 3 are mounted to the predetermined portion. In this case, the electronic components 3 can be mounted to the multilayer wiring board 2 by heating due to solder reflow.

Thus, the vehicle-mounted board 1 provided with the predetermined electronic circuits including the chip resistance 4 can be manufactured.

According to this embodiment, the electrodes 4a of the chip resistance 4 embedded in the multilayer wiring board 2 are respectively connected with the lands 6a and 6b arranged at the outer surfaces of the multilayer wiring board 2, through the inner wiring units 8 each of which is constructed of the conductive patterns 6 and the viae 7. In this case, the inspection lands 6c and 6d are arranged at the outer surface of the multilayer wiring board 2 of the opposite side to the lands 6a and 6d, and the inspection lands 6c and 6d are receptively connected with the electrodes 4a of the chip resistance 4 through the inspection wiring units 16. Therefore, the faulty wiring of the inner wiring units 8 can be receptively detected by measuring the resistance value between the lands 6a and 6c and that between the lands 6b and 6d.

Moreover, because the inspection wiring unit 16 is simultaneously formed in addition to the inner wiring unit 8 when the base material member 9 is manufactured, the manufacture process can be readily performed without much increasing the cost.

Second Embodiment

In the above-described first embodiment, the faulty wiring at the inner wiring unit 8 which connects the land 6a and the one electrode 4a of the chip resistance 4 is detected, by measuring the resistance value between the land 6a and the inspection land 6c which are respectively arranged at the two opposite side of the multilayer wiring board 2. Similarly, the faulty wiring at the inner wiring unit 8 which connects the land 6b and the other electrode 4a of the chip resistance 4 is detected, by measuring the resistance value between the land 6b and the inspection land 6d which are respectively arranged at the two opposite side of the multilayer wiring board 2.

Figure 6:
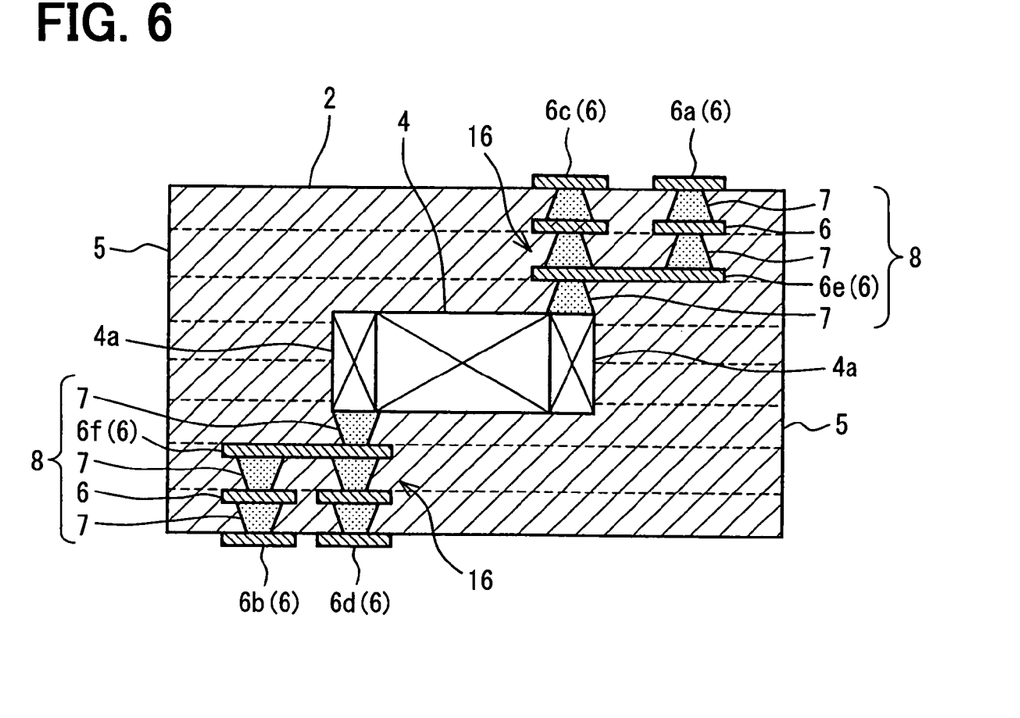
FIG. 6 is a longitudinally partially sectional view showing a multilayer wiring board according to a second embodiment of the present disclosure.

According to a second embodiment of the present invention, with reference to FIG. 6, the inspection land 6c and the land 6a are arranged at the same outer surface of the multilayer wiring board 2. On the other hand, the inspection land 6d and the land 6b are arranged at the same outer surface of the multilayer wiring board 2 which is at the opposite side to that where the inspection land 6c and the land 6a are arranged.

In this case, the inspection wiring unit 16 for detecting the faulty wiring in the inner wiring unit 8 which connects the land 6a with the one electrode 4a connects the inspection land 6c with the conductive pattern 6 (which contacts the via 7 mounted to the one electrode 4a and is numbered 6e for distinction with other conductive patterns 6) of this inner wiring unit 8. That is, according to the second embodiment, the inspection wiring unit 16 is connected with a predetermined portion of the inner wiring unit 8.

Thus, the faulty wiring of this inner wiring unit 8 can be detected by measuring the resistance value between the land 6a and the inspection land 6c.

Similarly, the inspection wiring unit 16 for detecting the faulty wiring in the inner wiring unit 8 which connects the land 6b with the other electrode 4a of the chip resistance 4 connects the inspection land 6d with the conductive pattern 6 (which contacts the via 7 mounted to the other electrode 4a and is numbered 6f for distinction with other conductive patterns 6) of the inner wiring unit 8. Thus, the faulty wiring of this inner wiring unit 8 can be detected by measuring the resistance value between the land 6b and the inspection land 6d.

Third Embodiment

Figure 7:
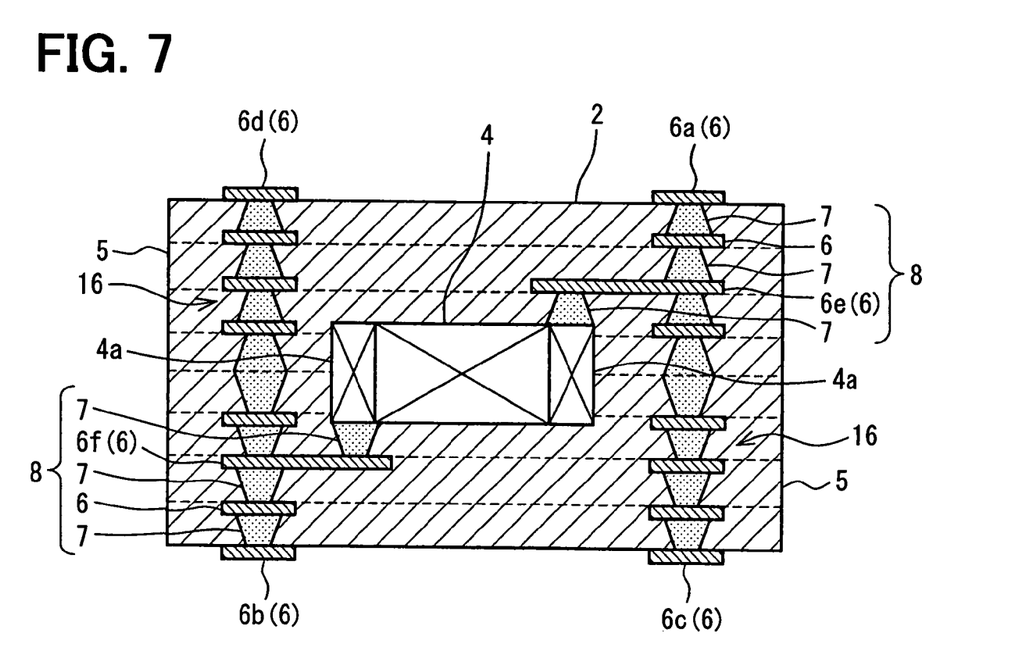
FIG. 7 is a longitudinally partially sectional view showing a multilayer wiring board according to a third embodiment of the present disclosure.

According to a third embodiment of the present invention, with reference to FIG. 7, the inspection land 6d and the land 6a are arranged at the same outer surface of the multilayer wiring board 2. On the other hand, the inspection land 6c and the land 6b are arranged at the same outer surface of the multilayer wiring board 2 which is at the opposite side to that where the inspection land 6d and the land 6a are arranged.

In this case, the inspection wiring unit 16 for detecting the faulty wiring in the inner wiring unit 8 which connects the land 6a with the one electrode 4a connects the inspection land 6c with the conductive pattern 6e (which contacts the via 7 mounted to the one electrode 4a) of this inner wiring unit 8. Thus, the faulty wiring of this inner wiring unit 8 can be detected by measuring the resistance value between the land 6a and the inspection land 6c.

Similarly, the inspection wiring unit 16 for detecting the faulty wiring in the inner wiring unit 8 which connects the land 6b with the other electrode 4a of the chip resistance 4 connects the inspection land 6d with the conductive pattern 6f (which contacts the via 7 mounted to the other electrode 4a) of the inner wiring unit 8. Thus, the faulty wiring of this inner wiring unit 8 can be detected by measuring the resistance value between the land 6b and the inspection land 6d.

Fourth Embodiment

Figure 8:
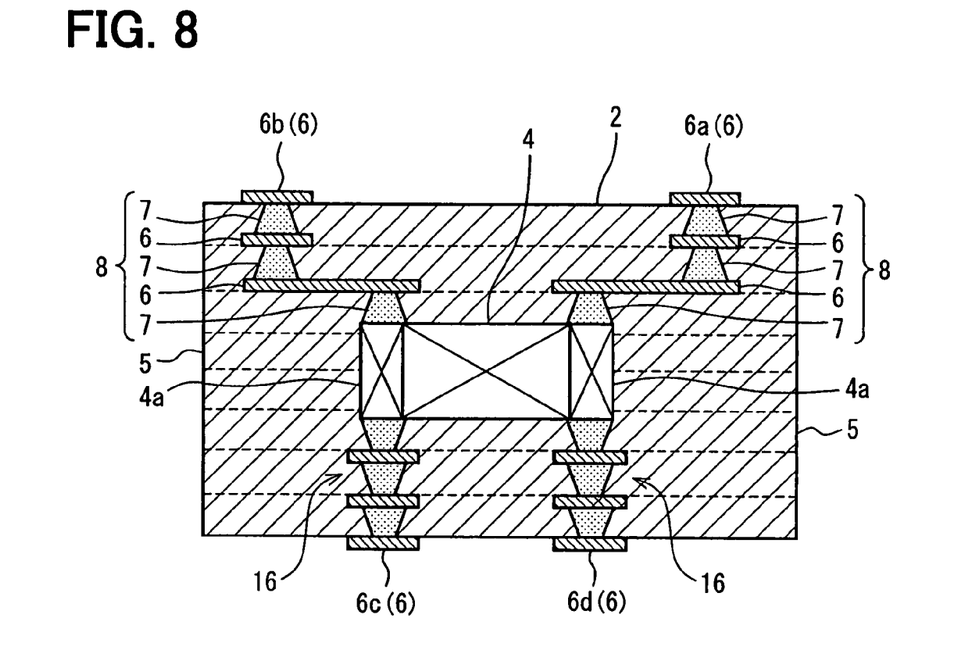
FIG. 8 is a longitudinally partially sectional view showing a multilayer wiring board according to a fourth embodiment of the present disclosure.

According to a fourth embodiment of the present invention, with reference to FIG. 8, the lands 6a and 6b are arranged at the same surface of the multilayer wiring board 2. The inspection lands 6c and 6d are arranged at the same surface of the multilayer wiring board 2 which is at the opposite side to that where the lands 6a and 6b are arranged.

In this case, the lands 6a and 6b are respectively connected with the one electrode 4a and the other electrode 4a of the chip resistance 4 through the inner wiring units 8, so that the electronic circuit including the chip resistance 4 can be constructed. According to this embodiment, the inspection land 6d is connected with the one electrode 4a and the inspection land 6c is connected with the other electrode 4a, respectively through the two inspection wiring units 16.

Thus, the faulty wiring of the inner wiring units 8 can be detected, by respectively measuring the resistance value between the land 6a and the inspection land 6d and that between the land 6b and the inspection land 6c.

Other Embodiment

Although the present invention has been fully described in connection with the preferred embodiments thereof with reference to the accompanying drawings, it is to be noted that various changes and modifications will become apparent to those skilled in the art.

For example, in the above-described embodiments, the chip resistance 4 is examplified as the electronic component which is embedded the multilayer wiring board 2. However, the present invention can be also suitably used for a board where other electronic components (e.g., sensors or the like) are embedded in the multilayer wiring board 2.

Moreover, in the above-described embodiments, the insulating layer 5 (film 10 of base material member 9) is constructed of the thermoplastic resin of the crystalline transition type such as the mixture of the polyetheretherketone (PEEK) and the polyetherimide (PEI). However, the insulating layer 5 can be also constructed of the polyetheretherketone (PEEK), or the polyetherimide (PEI), or the mixture of the polyetheretherketone (PEEK) and a filler, or the mixture of the polyetherimide (PEI) and a filler, or a liquid crystal polymer, or the like.

Such changes and modifications are to be understood as being in the scope of the present invention as defined by the appended claims.

What is claimed is:

1. A component-embedded board device, comprising:
   a wiring board in which an electronic component is embedded, the wiring board including a plurality of insulating layers each of which is made of a thermoplastic resin, the insulating layers being stacked in a stacking direction and collectively pressed at a high temperature and a high pressure to construct the wiring board;
   a connection member which is conductive and arranged at a surface of the wiring board;
   an inner wiring unit which is arranged in the wiring board and conductively connects an electrode of the electronic component with the connection member;
   an inspection connection member for an inspection of faulty wiring of the inner wiring unit, the inspection connection member being conductive and arranged at a surface of the wiring board; and
   an inspection wiring unit which is arranged in the wiring board and conductively connects the inspection connection member with one of the electrode and a predetermined portion of the inner wiring unit, wherein
   the inner wiring unit non-linearly extends between the electrode of the electronic component and the connection member in the stacking direction, and
   the inspection wiring unit substantially linearly extends between the inspection connection member and the one of the electrode in the stacking direction.

2. The component-embedded board device according to claim 1, wherein
   the inspection wiring unit includes a plurality of vias which are arranged in the wiring board and arrayed substantially linearly.

3. The component-embedded board device according to claim 1, wherein:
   the electronic component is a chip passive component;
   the surface of the wiring board where the inspection connection member is arranged is at an opposite side to that where the connection member is arranged; and
   the inner wiring unit and the inspection wiring unit are respectively connected with two opposite surfaces of the electrode of the chip passive component.

4. The component-embedded board device according to claim 1, wherein
   the inspection wiring unit and the inner wiring unit contact with the same electrode of the electronic component.

5. The component-embedded board device according to claim 1, wherein
   each of the inner wiring unit and the inspection wiring unit is constructed of a plurality of conductive patterns and a plurality of vias which are alternately stacked.

6. The component-embedded board device according to claim 1, wherein
   each of the connection member and the inspection connection member is constructed of a conductive pattern.

7. A faulty wiring detecting method for the component-embedded board device according to claim 1, the faulty wiring detecting method comprising:
  detecting a resistance value between the connection member and the inspection connection member; and
  determining whether or not a faulty wiring occurs at the inner wiring unit based on the resistance value which is detected, wherein
  it is determined that the faulty wiring occurs at the inner wiring unit in the case where the resistance value is different from a normal value.

8. The component-embedded board device according to claim 1, wherein A resistance value of the electronic component is at least 1 MΩ.

9. The faulty wiring detecting method according to claim 7, wherein
  it is determined that the faulty wiring occurs at the inner wiring unit in the case where the resistance value is larger than a predetermined value.

* * * * *